United States Patent [19]
Gosula et al.

[11] Patent Number: 6,009,550
[45] Date of Patent: Dec. 28, 1999

[54] PBA RECOVERY APPARATUS AND METHOD FOR INTERLEAVED REED-SOLOMON CODES

[75] Inventors: Venkata Raja Gosula; Schweiray Joseph Lee, both of Santa Cruz; Clifton James Williamson, Soquel, all of Calif.

[73] Assignee: Seagate Technology, Inc., Scotts Valley, Calif.

[21] Appl. No.: 08/959,516

[22] Filed: Oct. 28, 1997

Related U.S. Application Data

[60] Provisional application No. 60/047,303, May 20, 1997.

[51] Int. Cl.$^6$ ................................................. G11B 20/18
[52] U.S. Cl. ........................ 714/769; 360/49; 360/53; 369/47; 714/805
[58] Field of Search ........................ 360/53, 49; 369/47; 714/765, 768, 769, 805

[56] References Cited

U.S. PATENT DOCUMENTS

| | | | |
|---|---|---|---|
| 5,182,752 | 1/1993 | DeRoo et al. | 371/37.1 |
| 5,640,286 | 6/1997 | Acosta et al. | 360/48 |
| 5,696,775 | 12/1997 | Nemazie et al. | 371/51.1 |
| 5,717,535 | 2/1998 | French et al. | 360/53 |
| 5,805,799 | 9/1998 | Fredrickson et al. | 395/185.05 |
| 5,828,513 | 10/1998 | Greenberg | 360/77.08 |
| 5,850,379 | 12/1998 | Moriya et al. | 369/59 |
| 5,864,440 | 1/1999 | Hashimoto et al. | 360/53 |

*Primary Examiner*—Stephen M. Baker
*Attorney, Agent, or Firm*—Steven F. Caserza; Flehr Hohbach Test Albritton & Herbert

[57] ABSTRACT

The present invention pertains to a method for determining if data read from a storage medium has been read from physical block address (PBA) other than the expected PBA. Data that is stored on the data storage medium is encoded in accordance with a protocol that includes randomizing the data and combining the first k×2t bytes of the data with a PBA string, where t is the error correction capacity associated with the error correction technique used in the data storage system and k is the number of bytes of the PBA that are used in the PBA string. In addition, the data is k-way interleaved with parity data appended to it. When the data is read from the data storage medium, the data is decoded using a scheme corresponding to the encoding protocol. If errors are present in the data and exceed the error correction capacity, the first 2t bytes of each interleave are marked as erasures and a second correction is performed by an error correction unit. If the error values in each interleave are all the same, a PBA error is presumed to be the source of the errors. The actual PBA from which the data was read is then determined.

29 Claims, 9 Drawing Sheets

PBA RECOVERY APPARATUS AND METHOD FOR INTERLEAVED REED-SOLOMON CODES

RELATED APPLICATION

This application claims priority under 35 USC 119(e)(1) to provisional application Ser. No. 60/047,303, filed May 20, 1997.

TECHNICAL FIELD OF THE INVENTION

The present invention relates generally to error correction. More particularly, the invention relates to a physical block address (PBA) recovery mechanism for interleaved Reed-Solomon (RS) codes.

BACKGROUND OF THE INVENTION

Since a storage medium is subject to various types of noise, distortion and interference, various errors can occur at the output of the storage medium. The current trend is to store greater amounts of digital data in smaller areas on the storage medium. This trend increases the probability of errors. To correct the errors, error correction coding is used.

There are various error correction coding techniques. One class of such error correction codes is the well-known Reed Solomon (RS) codes. The Reed Solomon (RS) encoding technique appends to each block of b user data symbols 2t redundancy symbols to create a codeword (where t represents the designed symbol error correcting capacity of the code). There are b+2t symbols in a RS codeword. The RS codewords are transmitted to and from the storage medium with a certain error probability. During the decoding phase, certain error patterns introduced from the transmission of the data from the storage medium can be detected and the original data reconstructed by analyzing the received data.

Often errors occur in bursts rather than in random patterns, so that several consecutive bytes are in error. If all the errors in such a burst are confined to a single codeword, the error correction coding technique may not be able to correct these errors, since the coding technique's capacity is limited to correcting a predefined number of errors and the error burst may exceed this capacity. Interleaving is often used to overcome this problem. Interleaving is a technique that distributes user data symbols over several codewords so that the symbols from any given codeword are well separated during transmission. When the codewords are reconstructed during the decoding process, error bursts introduced during the transmission are broken up and spread across several codewords. The distribution of the errors in this manner is done so that the number of errors present in a codeword is more likely to be within the capacity of the error correction technique.

Encoded data is stored at a certain physical block address (PBA) on the storage medium. The PBA can be used in the encoding process in such a way that if encoded data is decoded using a different PBA, then the decoding process will fail, i.e., the data will appear to have uncorrectable errors. When uncorrectable data is detected, it is beneficial to know the source of the errors. Accordingly, there exists a need for an encoding scheme that addresses this problem.

SUMMARY OF THE INVENTION

The present invention pertains to a method and apparatus for encoding data using a physical block address (PBA) and for detecting when it is highly probable that erroneous data read from a data storage medium is attributable to having read the data from a PBA other than the expected PBA. In addition, the technology of the present invention determines the actual PBA from which the data was read.

The data storage system in the present invention utilizes an interleaved RS t error correcting coding technique with k interleaves. The data is interleaved and encoded with parity bytes. Before data and parity bytes are written to the disk, these bytes are combined by means of an exclusive-or operation (XOR) with a PBA string and then are randomized. A PBA consists of j bytes, where $j \geq k$, and identifies the location on the disk where the data and parity are to be stored. A PBA string consists of k bytes of the PBA repeated 2t times. Since there are k interleaves, the first PBA byte is XORed into the first 2t bytes of the first interleave, the second PBA byte is XORed into the first 2t bytes of the second interleave, and so on.

An attempt is made to read data from the data storage medium from a specified PBA (this PBA will be referred to as the "expected" PBA). The retrieved data is derandomized and then combined by means of an exclusive-or operation with the PBA string derived from the expected PBA. It is possible that the data was read from a PBA other than the expected PBA (this other PBA will be referred to as the "actual" PBA). In this case, the data was encoded with a PBA string derived from the actual PBA. Thus, when the data is decoded using the expected PBA, 2t errors will have been introduced into one or more interleaves. The modified data is first analyzed to determine whether any errors exist in the retrieved data. If the number of errors in a given interleave exceeds t, a second correction using erasure flags ("PBA recovery") is performed to determine if the errors are the result of a PBA error. A PBA error is highly probable when identical byte errors occur in the first 2t bytes in every interleave in which errors occur. When this condition occurs in each interleave and the errors values are non-zero in at least one interleave, the source of the erroneous data is flagged as a PBA error and the actual PBA is computed from the expected PBA and the computed byte errors.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
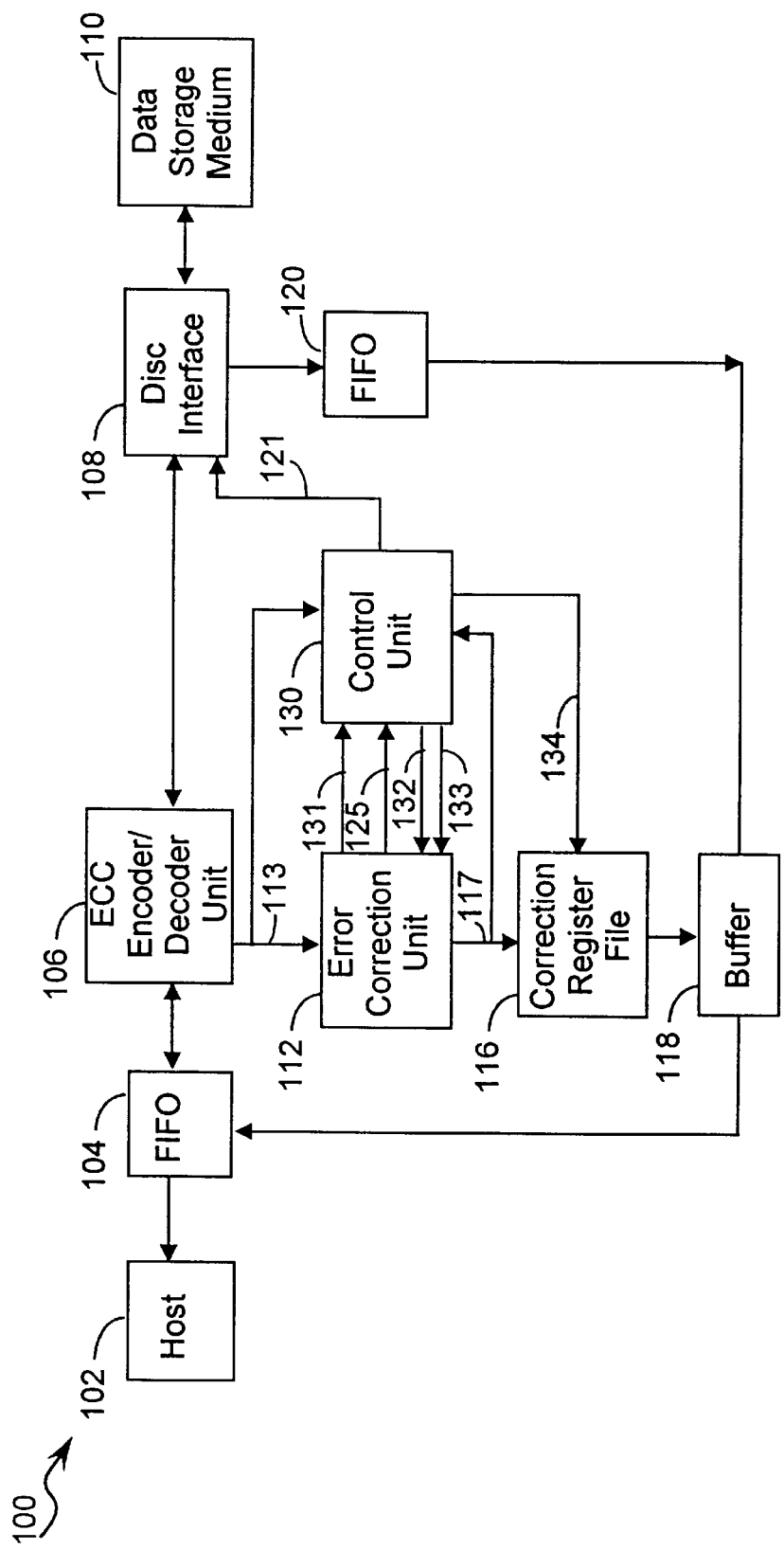
FIG. 1 is a block diagram of a data storage system used in a first preferred embodiment of the present invention.

FIG. 1 illustrates a first preferred embodiment of the data storage system 100 of the present invention. A host computer system 102 reads data from a data storage medium 110 and writes data to the data storage medium 110. A first FIFO 104 is used to temporarily store the data that is transferred between the host and the data storage medium 110. When the host 102 writes data to the data storage medium 110, the user data stored in FIFO 104 is transmitted to the error correction code (ECC) encoder/decoder unit 106 that encodes the user data and appends parity bytes. The encoded data is written to the data storage medium 110 by the disc interface 108.

Data that is read from a data storage medium 110 is read by the disc interface 108 and transferred to buffer 118 through FIFO 120. In addition, the read data is transmitted to the ECC encoder/decoder unit 106. The ECC encoder/decoder unit 106 computes syndromes and determines whether the received data contains any bytes in error. An error is corrupted data in an unknown location. An erasure is a potentially corrupted data in a known location. The term erratum will refer to a corrupted byte of data and includes both an error and an erasure. In this embodiment, the ECC encoder/decoder unit 106 and the error correction unit 112 should support erasure flags. An erasure flag identifies a specific byte as having potentially bad data. Correcting or validating the data in that byte will be referred to as an erasure correction. A correction where the location of the invalid data must be determined by the error correction unit 112 is referred to as an error correction. In general, the error correction technique can correct v errors and e erasures whenever 2v+e≦2t. While the RS decoding algorithm allows up to 2t erasure flags per interleave, preferably no more than 2t-1 erasure flags can be used except during PBA recovery. Thus, no more than 2t-1 errata per interleave will be corrected except during PBA recovery. The ECC encoder/decoder unit 106 computes the syndromes 113 which are transmitted to the error correction unit 112 and the control unit 130.

The error correction unit 112 either computes the error locations and values 117 or determines that the data is uncorrectable. Normally, the error correction unit 112 will be executed only once for a particular set of data. However, when uncorrectable data is detected, the error correction unit 112 will be executed a second time for the same set of data.

In the case where the data is correctable, there are no more than 2t-1 errata in any interleave, so any errata that occurred were not the result of having read the data from a PBA other than the expected PBA. The control unit 130 enables the correction register file 116 through signal 134 to receive the error locations and values 117. The data in the buffer 118 is corrected using the error locations and values 117 stored in the correction register file 116 and is then transmitted to a host 102 via FIFO 104.

If the data is uncorrectable, an uncorrectable error signal is sent to the control unit 130, which determines whether the errors are attributable to an incorrect PBA. The control unit 130 flags the top 2t bytes in each interleave as erasures 132 and re-executes the error correction unit 112 via restart signal 133 to determine the error values. Since 2t bytes are flagged as erasures, error values will be computed only for those bytes. At the completion of this second pass, a done signal 131 is raised to interrupt the control unit 130. The control unit 130 receives the new error values 117 and determines whether a PBA error has occurred and, if so, computes the PBA from which the data was actually read. In the event of a PBA error, a second attempt can be made to read the data from the expected PBA.

The control unit 130 will signal a PBA error if the following two conditions are both met. First, in the i-th interleave, either no corrections were necessary or the same error value $E_i$ was computed for each of the first 2t bytes in that interleave. Second, the first 2t bytes must be corrected in at least one interleave (i.e. $E_i \neq 0$ for some i). If the "expected" PBA bytes are $P_1, \ldots, P_k$, then the "actual" PBA bytes are $P_1 \oplus E_1, \ldots, P_k \oplus E_k$, where $E_i$ is the error value computed for the i-th interleave.

Figure 2:
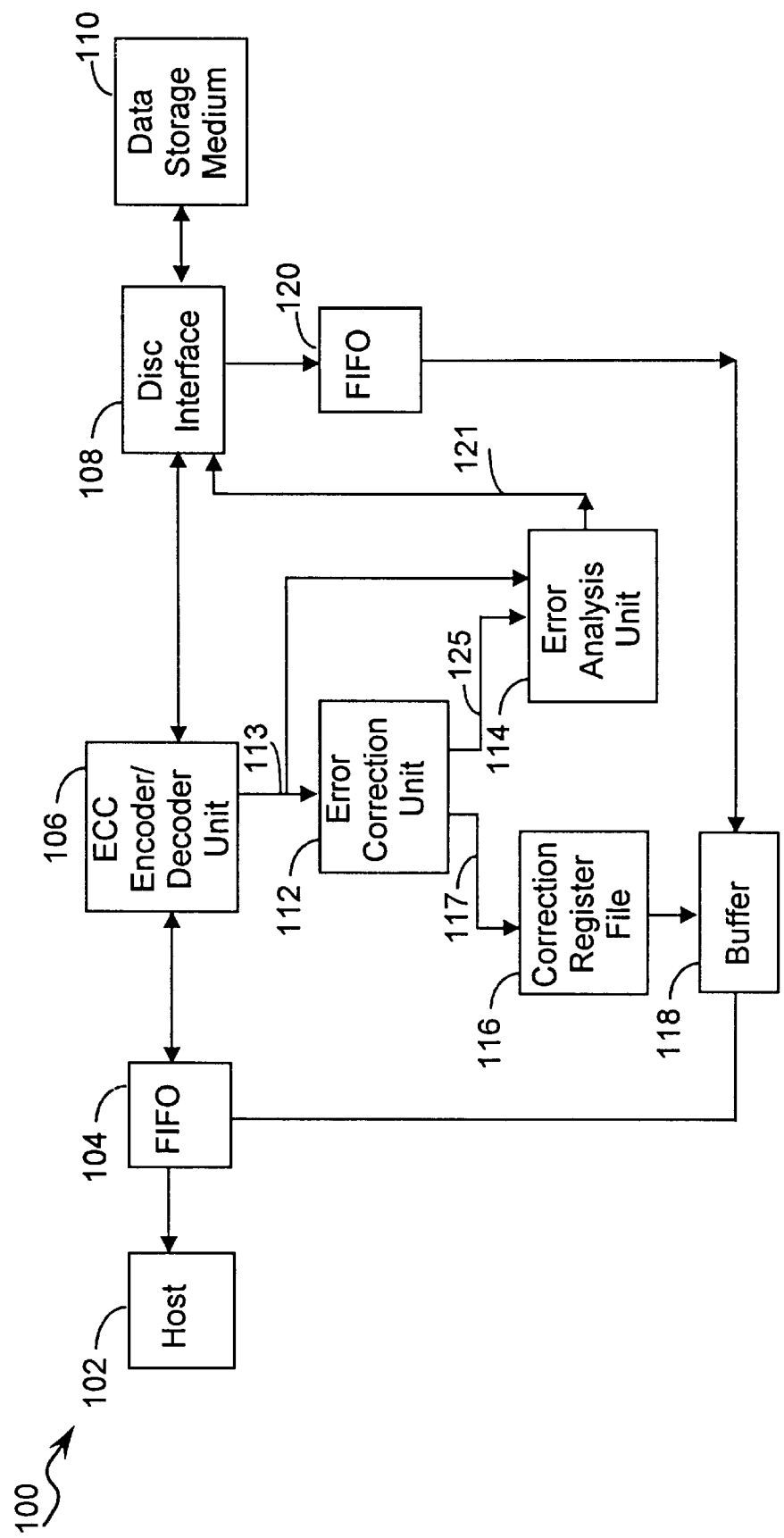
FIG. 2 is a block diagram of a data storage system used in a second preferred embodiment of the present invention.

FIG. 2 illustrates the data storage system 100 of a second preferred embodiment of the present invention. A host computer system 102 reads data from a data storage medium 110 and writes data to the data storage medium 110. A first FIFO 104 is used to temporarily store the data that is transferred between the host and the data storage medium 110. When the host 102 writes data to the data storage medium 110, the user data stored in FIFO 104 is transmitted to an error correction code (ECC) encoder/decoder unit 106 that encodes the data and appends parity bytes. The encoded data is written to the data storage medium 110 by the disc interface 108.

Data that is read from a data storage medium 110 is read by the disc interface 108 and transferred to buffer 118 through FIFO 120. In addition, the read data and parity data is transmitted to the ECC encoder/decoder unit 106. The ECC encoder/decoder unit 106 computes syndrome and determines whether the read data contains any errors. The ECC encoder/decoder unit 106 and the error correction unit 112 may or may not support erasure flags generated by the disc interface 108. If erasure flags are supported, preferably no more than 2t-1 erasure flags per interleave are allowed during hardware correction. The ECC encoder/decoder unit 106 computes syndromes 113 containing information about errors that are transmitted to the error correction unit 112. In addition, the syndromes 113 are transmitted to the error analysis unit 114.

The error correction unit 112 either computes the error locations and values 117 or determines that the data is uncorrectable. If the data is correctable, then the limit on the number of erasure flags again implies that the errata detected in the data were not the result of having read the data from a PBA other than the expected PBA. The error locations and values 117 are transmitted to the correction register file 116. The data in the buffer 118 is corrected using the error location and values 117 stored in the correction register file 116 and is then transmitted to a host 102 via FIFO 104.

If the number of errors exceeds the error correction capacity, an uncorrectable error flag 125 is raised and transmitted to the error analysis unit 114. The error analysis unit 114 performs a second correction using erasure flags to determine if the errors are due to an incorrect PBA and, if so, computes the PBA from which the data was actually read. In the event of a PBA error, a second attempt can be made to read the data from the expected PBA.

Figure 3:
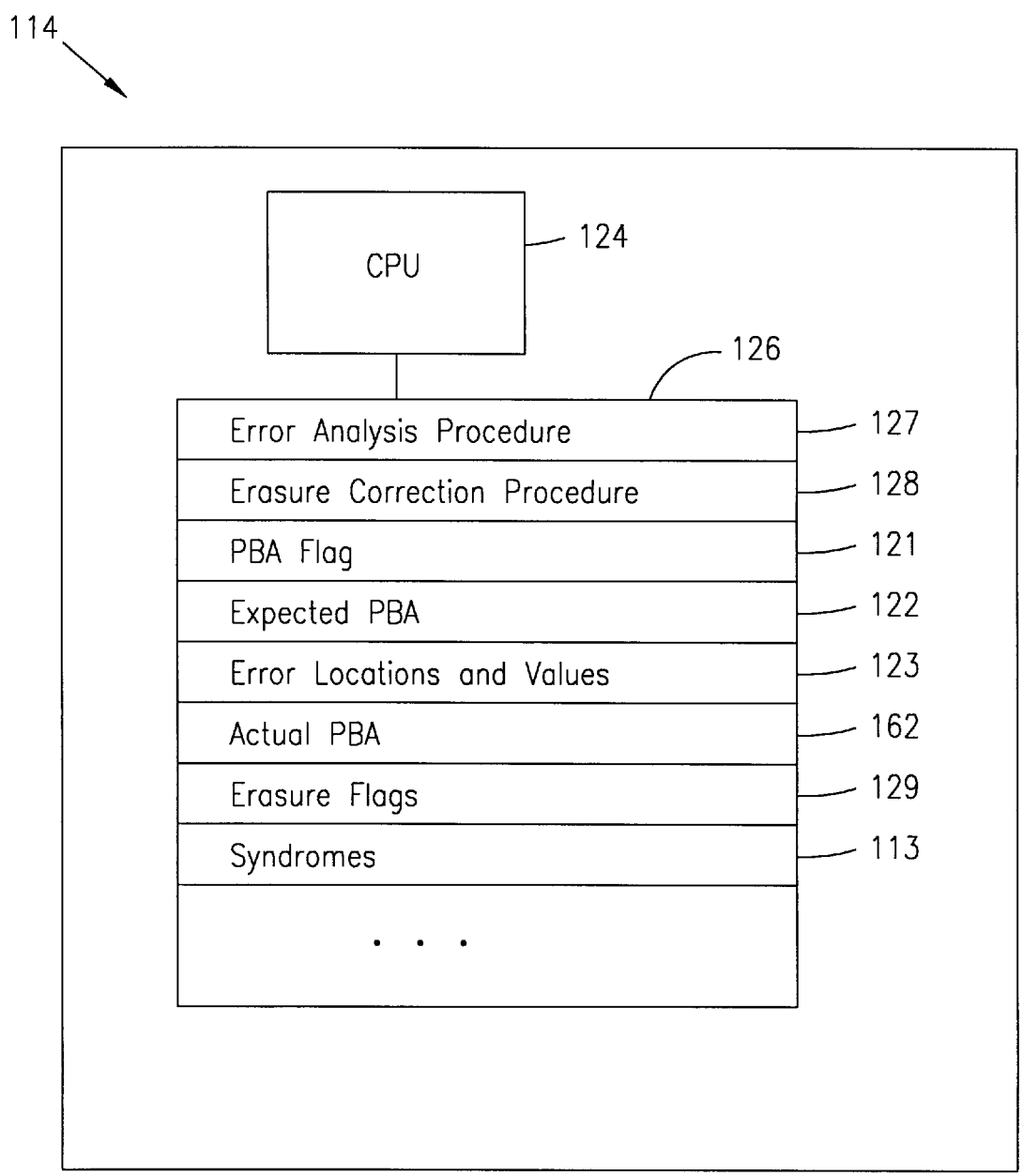
FIG. 3 is a block diagram of the error analysis unit shown in FIG. 2.

FIG. 3 illustrates the error analysis unit 114. The role of the error analysis unit 114 is to determine whether the errors are attributable to an incorrect PBA. Preferably, the error analysis unit 114 is a processing unit, such as a microprocessor, programmable logic controller, or the like, having a CPU 124 and memory 126 for executing programmable instructions.

The memory 126 can consist of an error analysis procedure 127 that determines whether the errors are attributable to an incorrect PBA and determines the "actual" PBA 122 from which the data was read; an erasure correction procedure 128 that is a firmware implementation similar to the error correction technique that is implemented in hardware in the error correction unit 112; a PBA flag 121 that indicates when the errors are attributable to a PBA error; the "actual" PBA 122; error values 123 computed by the erasure correction procedure 128; the "expected" PBA 162 used to encode and decode the data; erasure flags 129 indicating the locations of the erasures in the first 2t bytes of each interleave; the syndromes 113; as well as other data and procedures. The steps used by the error analysis procedure 127 will be described below.

Data Encoding

Figure 4:
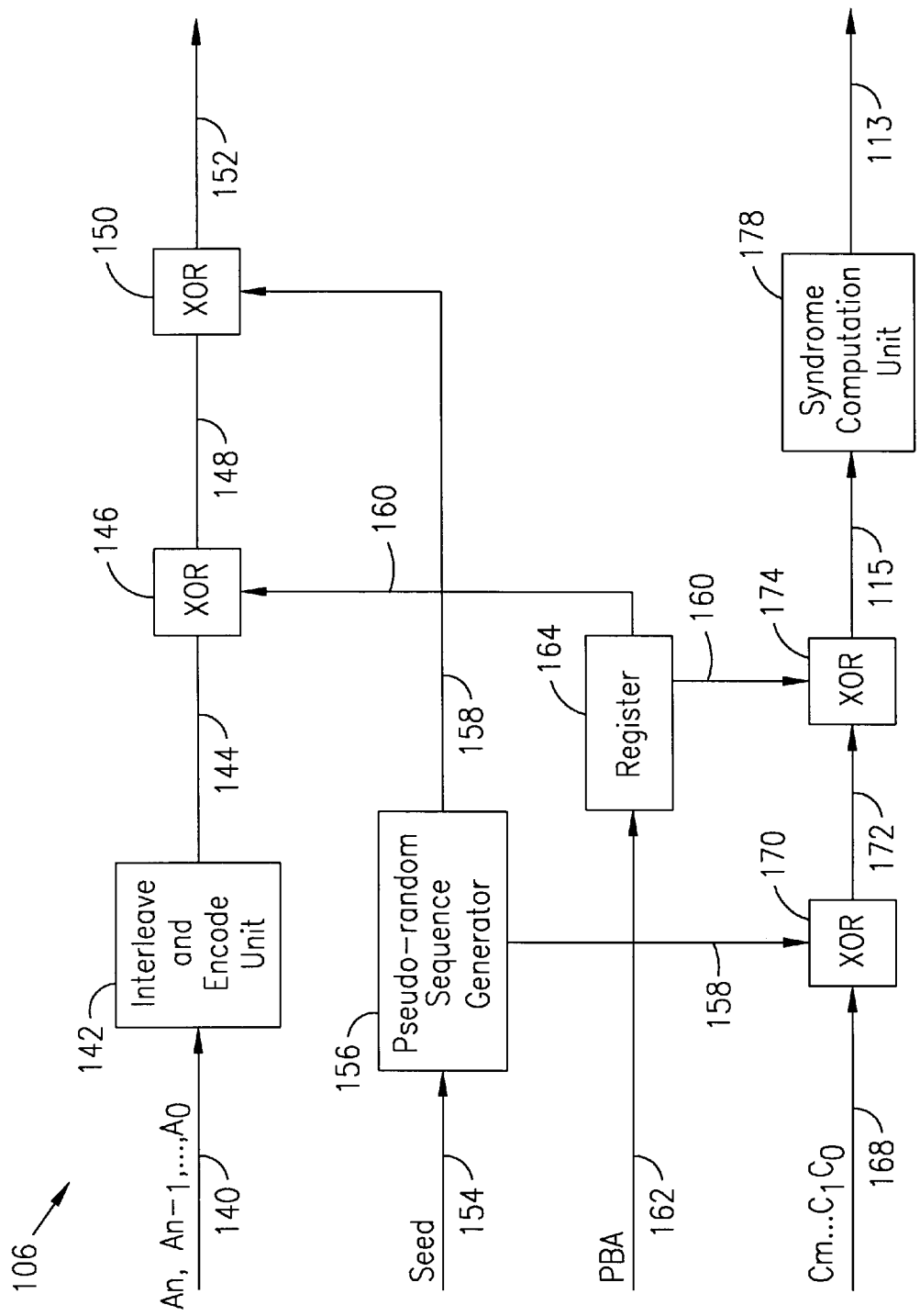
FIG. 4 is a block diagram of the ECC encoder/decoder unit shown in FIGS. 1 and 2.
Figure 5:
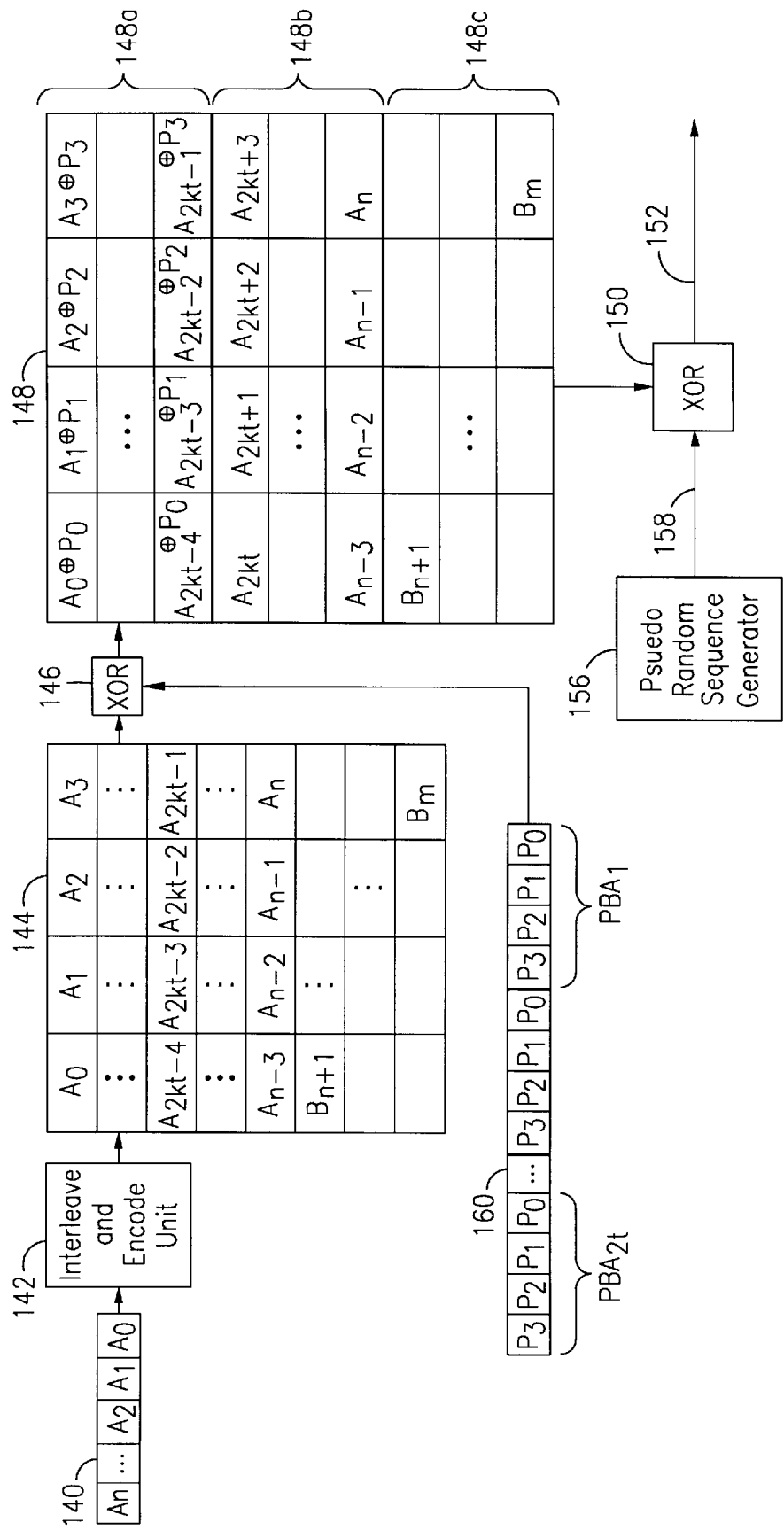
FIG. 5 illustrates the steps used in encoding data that is to be stored in the data storage medium using 4-way interleaving.
Figure 6:
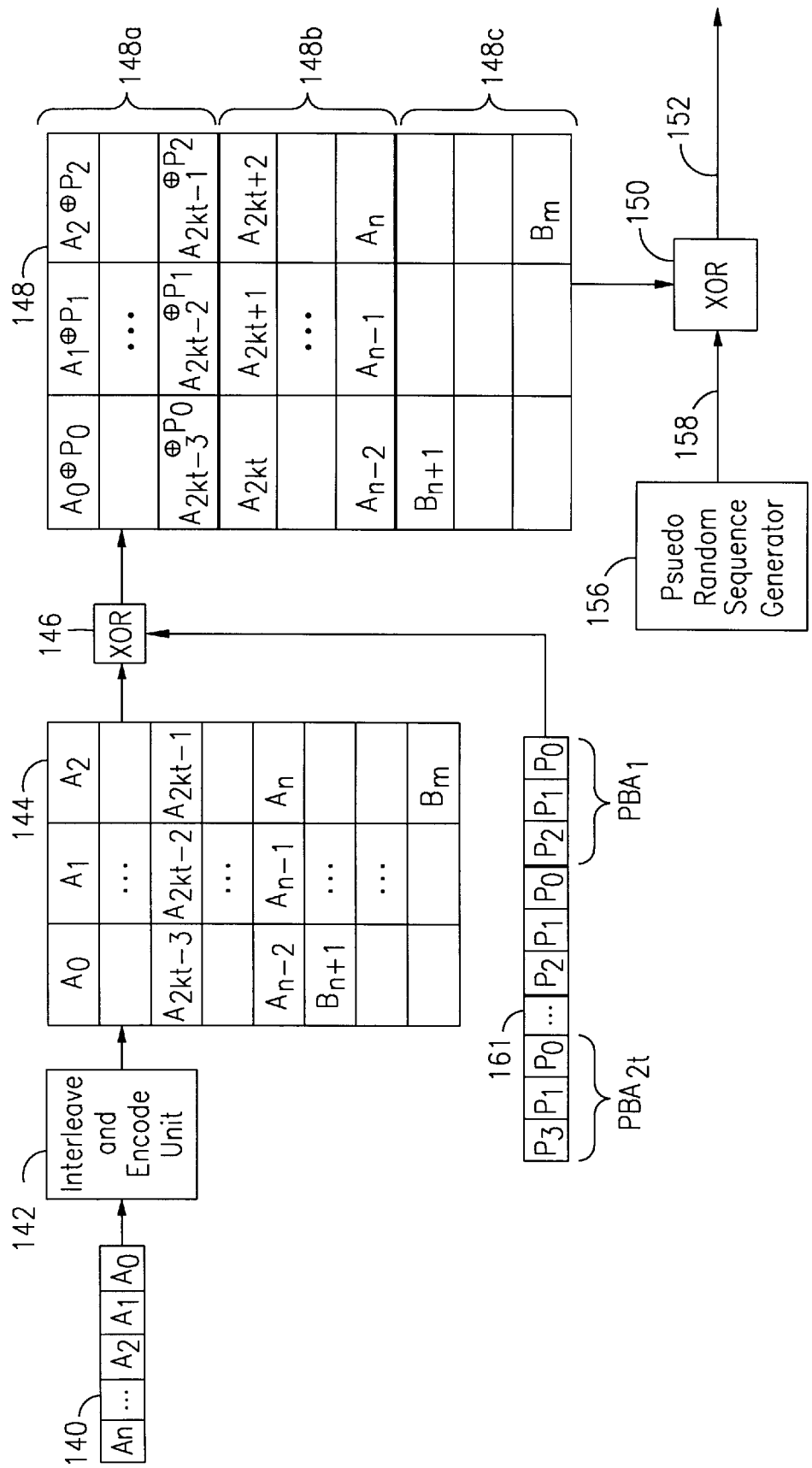
FIG. 6 illustrates the steps used in encoding data that is to be stored in the data storage medium using 3-way interleaving.

FIG. 4 illustrates the components of the ECC encoder/decoder unit 106 that are used to encode data that is written onto the data storage medium 110. FIGS. 5 and 6 illustrate the steps used in the encoding process. FIG. 5 illustrates the embodiment where 4-way interleaving is used and FIG. 6 illustrates the embodiment where 3-way interleaving is used to encode the data.

The ECC encoder/decoder unit 106 receives user data $A_0 A_1, \ldots, A_n$ 140 which will be stored on the data storage medium 110. The data 140 is transmitted to an interleave and encode unit 142 where the data is interleaved and then encoded with PBA and parity byte information. This data 148 is then randomized before it is stored on the data storage medium 110. Interleaving is well known in the art and the present invention is not limited to any particular interleaving methodology. For background information on interleaving techniques, Clark, et. al., *Error-Correction Coding for Digital Communications*, Plenum Press, 1988, can be referred to which is hereby incorporated by reference. The encoding of the parity byte information is also well known in the art and the present invention is not limited to any particular parity byte encoding methodology.

In a preferred embodiment, a systematic encoding procedure is employed in which data bytes appear as symbols in the codeword. Thus, the encoded data 144 is of the form $A_0, \ldots, A_n, B_{n+1}, \ldots, B_m$. The data 144 is then XORed through XOR unit 146 with a PBA string 160, 161 that is stored in register 164. In a preferred embodiment, the PBA 162 is a 4-byte identifier (e.g., $P_0 P_1 P_2 P_3$). In one embodiment where 4-way interleaving is used, the PBA string 160 consists of the 4-byte PBA repeated 2t times in sequence (e.g., $PBA_1, \ldots, PBA_{2t}$, where $PBA_1 = P_0 P_1 P_2 P_3$) (see FIG. 5). In a second embodiment where 3-way interleaving is used, the PBA string 161 consists of the first 3 bytes of the PBA (e.g., $P_0 P_1 P_2$) repeated 2t times in sequence (e.g., $PBA_1, \ldots, PBA_{2t}$, where $PBA_1 = P_0 P_1 P_2$) (see FIG. 6). In these embodiments, only the first k×2t bytes of the data 144 are XORed with the PBA string 160, 161 (where k is the number of bytes of the PBA that are used in the PBA string and preferably represents the number of interleaves used). The result of this combination is a sequence of data 148 that can be represented mathematically as $A_0 \oplus P_0, A_1 \oplus P_1, A_2 P_2, \ldots, A_{k \times 2t-1} \oplus P_{k-1}, A_{k \times 2t}, \ldots, A_n, B_{n+1}, \ldots, B_m$.

Randomization is achieved by combining the data 148 with a sequence of pseudo-random bytes 158. Preferably, a pseudo-random sequence of data is generated $PR_0, PR_1, \ldots, PR_m$ 158 and exclusive-ORed (XOR) through XOR unit 150 thereby generating randomized data 152. A pseudo-random sequence generator 156 is used to generate the pseudo-random sequence of data 158 using a fixed seed 154. The use of the fixed seed 154 enables the same sequence 158 to be regenerated in the decoding phase. Pseudo-random sequence generators are well known in the art and the present invention is not limited to any particular pseudo-random number generation technique.

In one embodiment 4-way interleaving is used when the data is encoded with a 4-byte PBA string (see FIG. 5). In another embodiment 3-way interleaving is used when the data is encoded with a 3-byte PBA string (see FIG. 6). Referring to FIG. 5, in the 4-way interleaving embodiment, the data encoded with PBA can be thought of as being partitioned into three blocks. The first block 148a contains the first 4×2t bytes of data with the PBA bytes XORed in with the data. The second block 148b contains the remainder of the data bytes (without the PBA bytes XORed in with the data). The third block 148c contains the parity bytes.

Referring to FIG. 6, in the 3-way interleaving embodiment, the data encoded with the PBA can be thought of as being partitioned in three blocks. The first block 148a contains the first 3×2t bytes of data with the PBA bytes XORed in with the data. The second block 148b contains the remainder of the data bytes (without the PBA bytes XORed in with the data). The third block 148c contains the parity bytes.

Data Decoding

Figure 7:
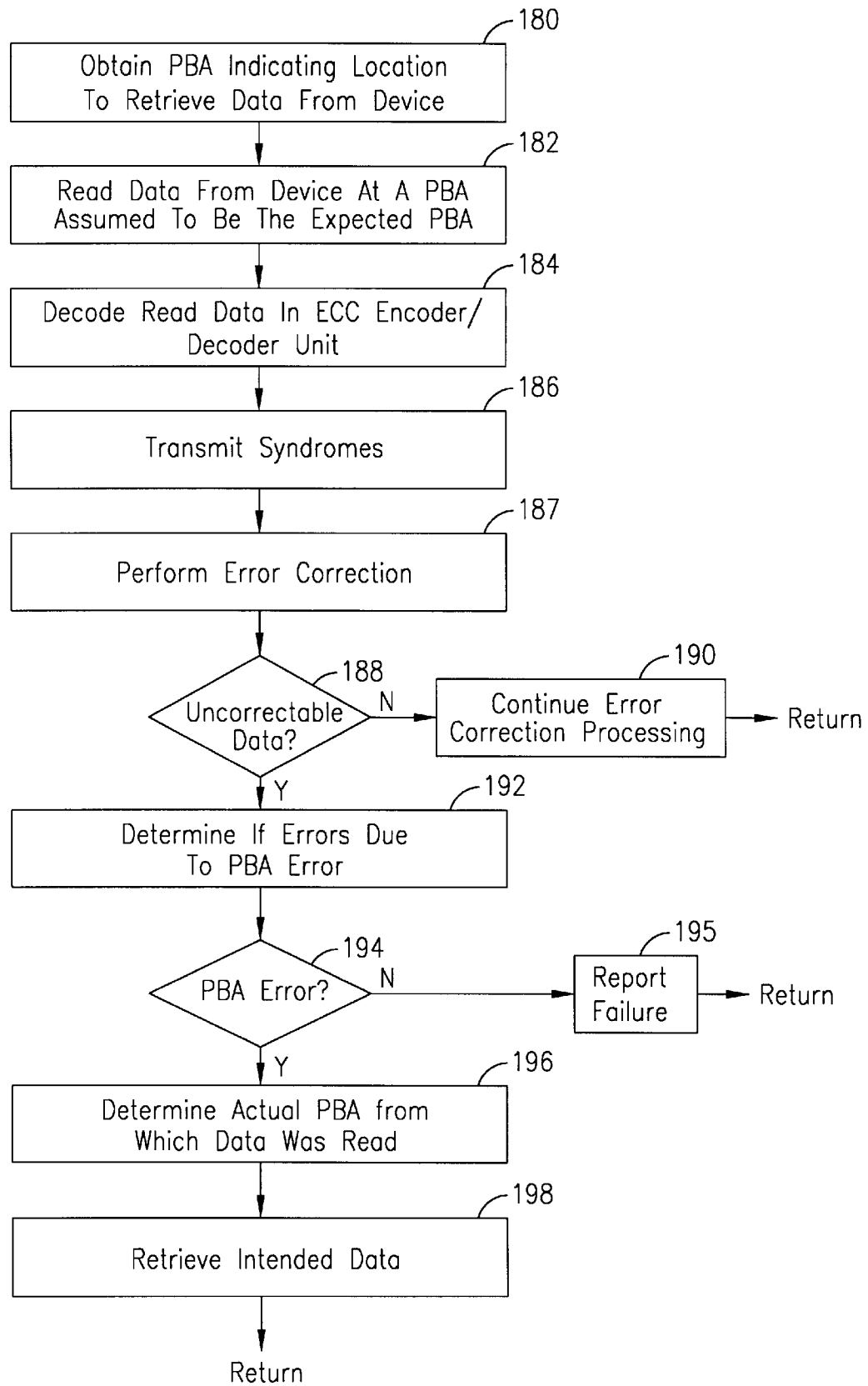
FIG. 7 is a flow chart illustrating the steps used in performing the PBA recovery method of the present invention.

FIG. 7 illustrates the steps used to retrieve and decode data from the data storage medium 110. An "expected" PBA is specified indicating the location from which the data is to be retrieved from the data storage medium 110 (step 180). In a first preferred embodiment of the present invention, the PBA string consists of 4-bytes indicating a block address on the disk. In a second preferred embodiment, the PBA string consists of 3-bytes indicating the low order bytes of a block address on the disk. The data is read from the data storage medium 110 and transmitted through disc interface 108 to the ECC encoder/decoder unit 106 (step 182).

Figure 8:
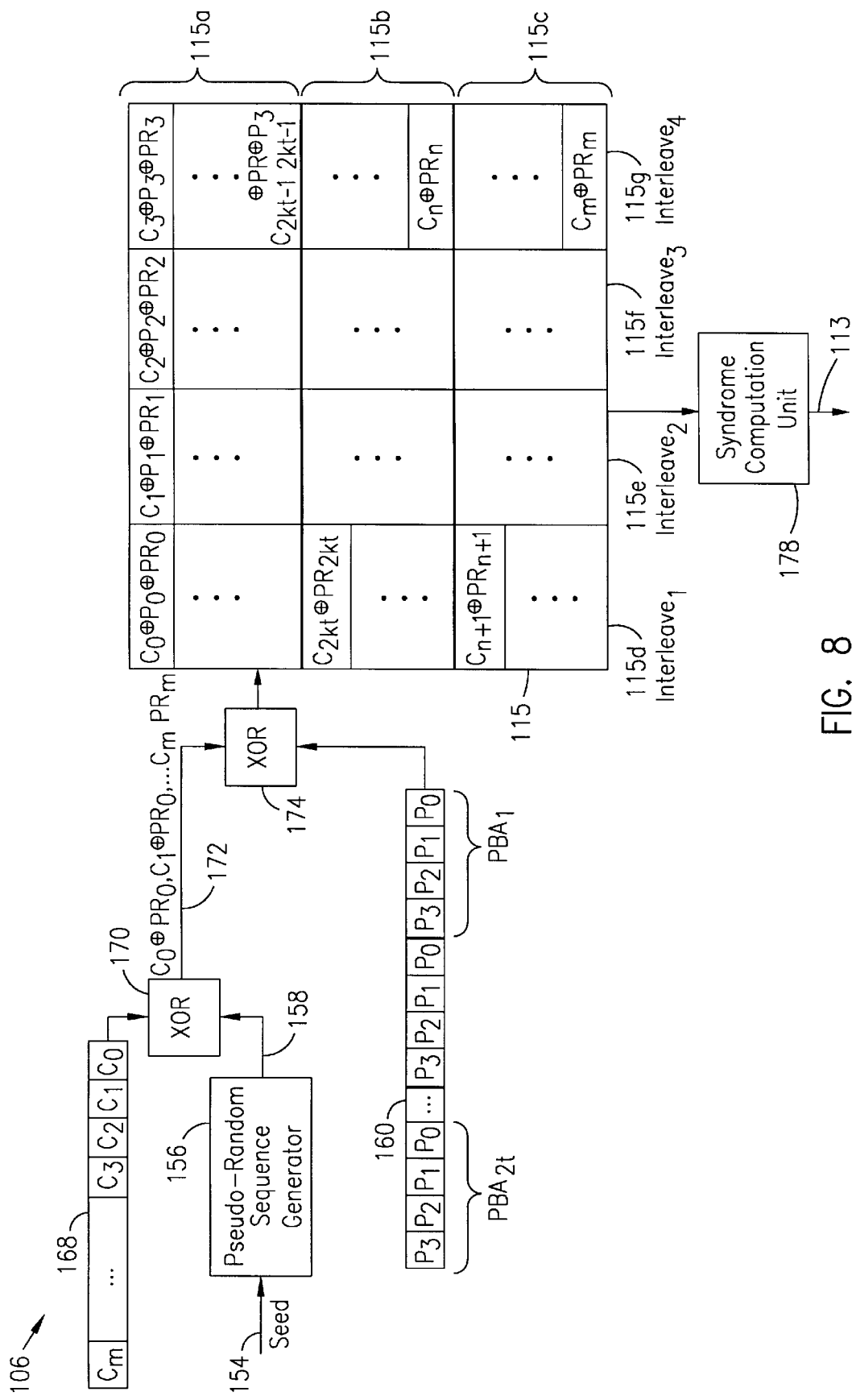
FIG. 8 illustrates the steps used in decoding data that is read from a data storage medium and the components of the ECC encoder/decoder unit that perform these steps.

FIG. 8 illustrates the components and steps used by the ECC unit 106 to decode data read from the data storage medium 110 (step 184). The ECC encoder/decoder unit 106 decodes the data using the same protocol that was used to encode the data.

The ECC encoder/decoder unit 106 receives data $C_0, C_1, \ldots, C_m$ that is read from the data storage medium 110. This data 168 is XORed through XOR unit 170 with the same pseudo-random sequence of data $PR_0, PR_1, \ldots, PR_m$ 158 that was used to encode the data. The pseudo-random sequence generator 156 is used with the same seed 154 that encoded the data to generate the same pseudo-random sequence of data $PR_0, PR_1, \ldots, PR_m$. The result is a sequence of data 172 which can be described mathematically as $C_0 \oplus PR_0, \ldots C_m \oplus PR_m$. The data 172 is then XORed through XOR unit 174 with the PBA string 160, 161. The same PBA string 160, 161 that was used to encode the data is used to decode the data. For illustration purposes only, FIG. 8 shows the PBA string 160 utilizing a 4-byte PBA. However, the PBA string 161 utilizing a 3-byte PBA can be used as well.

The resulting data 115 can be thought of as being partitioned into three blocks. The first block 115a contains the first k×2t bytes of data that has been XORed with the PBA string 160, 161 and the pseudo-random sequence of data. The second block 115b contains the remaining data that has been XORed with the pseudo-random sequence of data but not the PBA string. The third block 115c contains the parity bytes XORed with the pseudo-random sequence. This data 115 is then transmitted to the syndrome computation unit 178.

The syndrome computation unit 178 computes the syndromes 113 which are then transmitted to the error correction unit 112, error analysis unit 114, or control unit 130 (step 186). Syndrome determination is well known in the art and the present invention is not constrained to any particular syndrome computation methodology or implementation thereof A more detailed discussion of syndrome computation can be found in the Clark reference cited above.

The error correction unit 112 is used to perform error correction by determining the error locations and values (step 187). The present invention is not constrained to any particular method for determining the error locations and values or any particular implementation of such methods. In a preferred embodiment, the error correction unit 112 can be the one described in the pending application entitled "An Apparatus and Method for Error Correction," assigned to Seagate Technology Inc., Ser. No. 08/841,942 filed on Apr. 8, 1997, which is hereby incorporated by reference.

Referring back to FIGS. 2 and 7, the outputs of the error correction unit 112 are the error locations and values 117 and an uncorrectable error flag 125. The uncorrectable error flag 125 is raised when the number of errors exceeds the error correction capacity. When the number of errors is within the error correction capacity, (i.e., the number of errata is less than 2t–1) (step 188-N), the error locations and values 117 are transmitted to the correction register file 116 and the data in buffer 118 is corrected using the error locations and values 117 (step 190).

In the case where uncorrectable errors occur (step 188-Y), the uncorrectable error flag 125 is raised and transmitted to the error analysis unit 114 or control unit 130 in order to determine if the errors are attributable to a PBA error (step 192).

Figure 9:
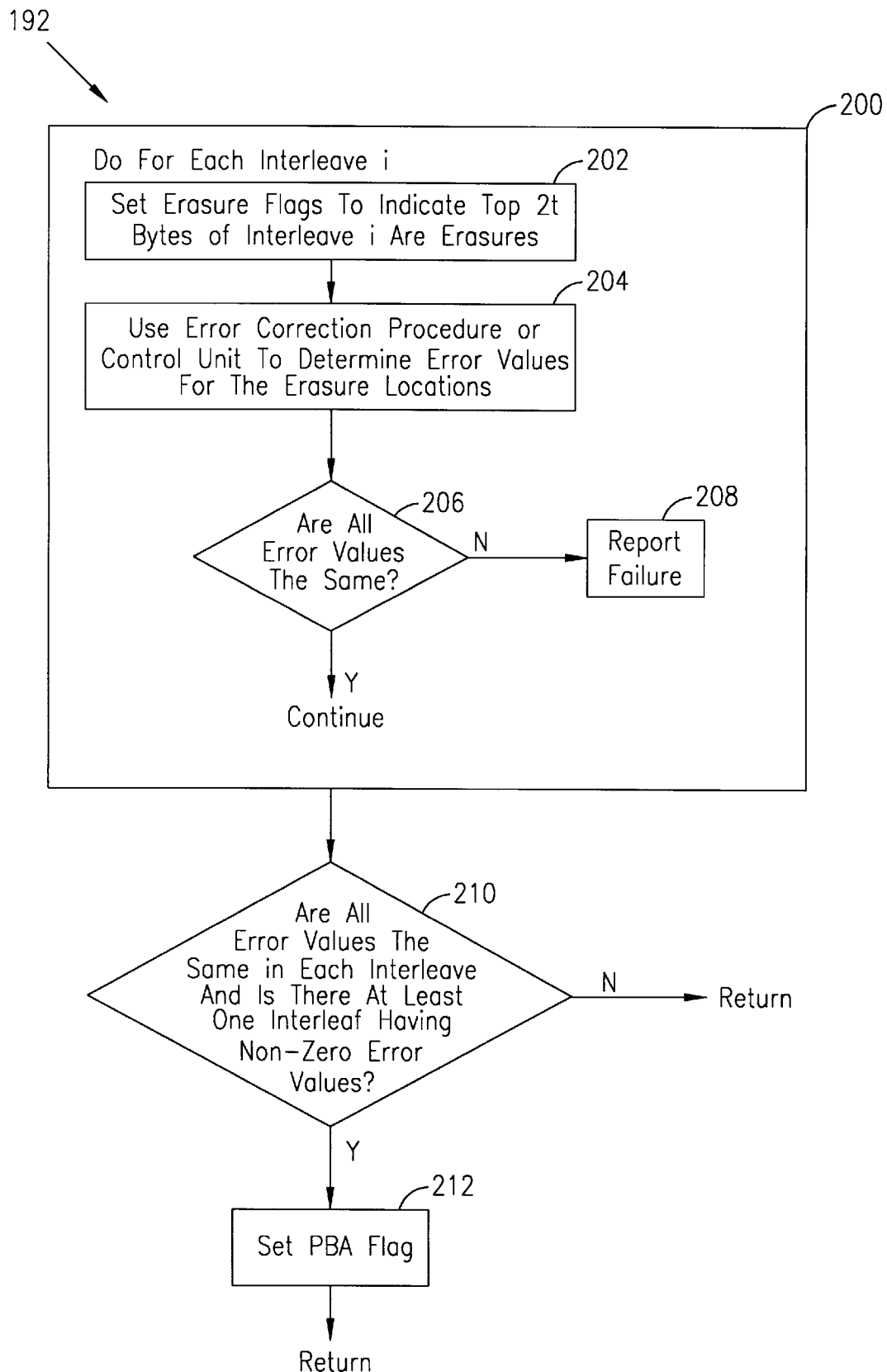
FIG. 9 is a flow chart illustrating the steps used to determine if a PBA error has occurred.

FIG. 9 illustrates the steps used by the error analysis unit 114 in determining whether the source of the errors is attributable to a PBA error. The error analysis unit 114 receives the syndromes 113 as shown in FIG. 2. The error analysis unit 114 is controlled by an error analysis procedure 127. The error analysis procedure 127 will perform a number of tasks in order to make the PBA error determination. Briefly, the error analysis procedure 127 will flag as erasures the positions of the top 2t bytes of each interleave. An erasure correction procedure 128 will be executed for each interleave to compute the error values for the erasure locations. The error analysis procedure 127 then analyzes the recomputed error values in accordance with a criterion to determine if it is likely that the errors are attributable to a PBA error.

It is highly likely that a PBA error has occurred when the error values at the erasure locations in each interleave have the same value and in at least one interleave the error values are non-zero. In this instance, the actual PBA can also be determined from the error values and the expected PBA.

The error analysis procedure 127 operates on each interleave i of the decoded data 115 (step 200). Referring to FIG. 8, an interleave i can be thought of as a column of the interleaved data (e.g., 115d–115g). Referring back to FIG. 9, the error analysis procedure 127 sets as erasure flags 129 the positions of the top 2t bytes of each interleave i (step 202). The error analysis procedure 127 will then execute an erasure correction procedure 128 to compute the error values for these erasure locations (step 204). The erasure correction procedure 128 can accept as inputs the erasure flags 129 indicating the locations of the erasures, the syndromes 113, as well as other parameters.

The error analysis procedure 127 then analyzes the computed error values at the erasure locations for each interleave. If, for every interleave, all error values in that interleave are not the same (step 206-N), the error analysis procedure 127 reports a failure and stops the error correction process (step 208). Otherwise, the procedure continues to the next interleave. After each interleave has been processed, the error analysis procedure 127 determines if the error values in each interleave are the same and if in at least one interleave, there are non-zero error values (step 210). If this criteria is met (step 210-Y), the PBA flag 121 is set (step 212).

Referring back to FIG. 7, once the PBA flag 121 is raised (step 194-Y), the error analysis procedure 127 then determines the actual PBA from the expected PBA string 160, 161 used to decode the data and the error values 123. In the case where k interleaves are used, k lower bytes of the PBA are used to encode the data, and each of these k bytes are associated with an interleave. After the PBA error flag is set, in each interleave the error values for each of the 2t erasure locations are identical and the k error values for their corresponding interleaves are not all-zero. The error analysis procedure 127 computes the actual PBA by XORing the error value from each interleave with its associated PBA byte. For example, the error value from the first interleave is XORed with $P_0$, the error value from the second interleave is XORed with $P_1$, and so on. The actual PBA 162 identifies the physical block address from which the data was actually read from and can then be used to reread the data from the intended location on the data storage medium 110. In an alternate embodiment, the actual PBA 162 can be used for diagnostic purposes without initiating a reread of the data.

In an alternate embodiment, the PBA recovery protocol can be performed utilizing the data storage system illustrated in FIG. 1. The same steps are performed as was described above with respect to FIGS. 7 and 9. However, the manner in which these steps are executed differs somewhat and those differences are described below.

Referring to FIGS. 1, 7 and 9, steps 180 through 187 are performed as indicated above. When the error correction unit 112 detects uncorrectable errors, an uncorrectable flag 125 is raised which activates control unit 130 (step 188-Y). The control unit 130 then performs the steps shown in FIG. 9 for each interleave (step 200). The control unit 130 proceeds to mark the top 2t bytes of the data in each interleave as erasure locations through erasure flag signal 132 (step 202). Then the restart signal 133 is raised by the control unit 130 to reactivate execution of the error correction unit 112 (step 204). This time an erasure correction will be performed. When the error correction unit 112 is finished, the done signal 131 is raised which activates the control unit 130 to read the computed error values 117 at the erasure locations. The control unit 130 then determines whether all the error values in a certain interleave are the same (step 206). If this criterion is not met (step 206-N), the control unit reports failure and stops the error correction process (step 208). After each interleave is processed, the control unit determines whether all the error values in each interleave are the same and whether in at least one interleave, there are non-zero error values. If this criterion is met (step 21 0-Y), an internal PBA error flag is set (step 212).

When the internal PBA error flag is set, the control unit 130 determines the actual PBA by performing an XOR operation with the received error values and the expected PBA byte associated with that interleave (step 196). The actual PBA indicates the location where the data was read from. The data retrieval operation can then be reinitiated to access the intended data (step 198).

Alternate Embodiments

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

The present invention has been described with respect to data storage devices. However, the present invention has broader application and can be applied to various types of mediums that utilize the RS class of codes, such as but not limited to CD ROMs, and the like.

Further, the method and system described hereinabove is amenable for execution on various types of executable mediums other than a memory device such as a random access memory. Other types of executable mediums can be used, such as but not limited to, a computer readable storage medium which can be any memory device, compact disc, or floppy disk.

What is claimed is:

1. A method for error correction in digital transmission, said method comprising the steps of:
    a) specifying a first physical location to access data from a data storage medium;
    b) detecting that the data contains a number of errors that exceeds a threshold;
    c) determining that the data was read from a second physical location; and
    d) reaccessing the data from the first physical location.

2. The method of claim 1, said step b) further comprising the steps of:
    1) flagging as erasure locations select portions of the data; and
    2) calculating an error value for each erasure location.

3. The method of claim 1, said step c) further comprising the steps of:
    determining that the data was read from a second physical location when in each select portion of the data, the error values in each erasure location are identical and there is at least one select portion of the data where the error values have a non-zero value.

4. The method of claim 1, said step b) further comprising the step of performing a first error correction procedure; and
    said step c) further comprising the step of performing a second error correction procedure using erasure flags.

5. The method of claim 1, wherein the physical locations are identified by a physical block address (PBA).

6. The method of claim 1, further comprising the steps of: prior to said step a),
    1) obtaining data for storage;
    2) encoding the data with a PBA string; and
    3) storing the encoded data at the first physical location.

7. The method of claim 6, said step 2) further comprising the steps of:
    interleaving the data in accordance with a prescribed criteria;
    appending parity data to the data;
    combining the data with a PBA string; and
    randomizing the data.

8. The method of claim 6, wherein the PBA string includes a same PBA repeated in sequence 2t times, where t is the error correction capacity associated with the data storage system;
    wherein each PBA includes at least k bytes; and
    wherein the prescribed criteria includes k-way interleaving.

9. The method of claim 7, said randomizing step further comprising the steps of:
    generating a sequence of pseudo-random numbers; and
    combining the pseudo-random numbers with the data.

10. The method of claim 9, said combining step further comprising the step of performing an exclusive-or operation with the pseudo-random number and the data.

11. The method of claim 7, said combining step further includes the step of performing an exclusive-or operation with a select portion of the data and the PBA string.

12. A computer readable storage medium for directing a data storage system to function in a specified manner, comprising:
    a first physical block address (PBA) for use in obtaining data from a data storage medium;
    a first correction procedure including instructions that determines a position and value for each error in the data, said first correction procedure using erasure flags; and
    an error analysis procedure including instructions that analyze the errors and that determine if the errors are attributable to a PBA error.

13. The apparatus of claim 12, the first correction procedure including instructions that determine if the data is uncorrectable, that flags select portions of the data as erasure locations, and that determines an error value for each erasure location; and
    the error analysis procedure including instructions that make the determination that the errors are attributable to a PBA error when in each select portion of the data all the erasure values are identical and in at least one such select portion, the erasure values have non-zero values.

14. The apparatus of claim 12, wherein the data is k-way interleaved;
    said error analysis procedure further including instructions to determine that a PBA error has occurred when in each interleave, all the erasure values are identical and there is at least one interleave having non-zero erasure values.

15. A method for accessing data stored in a data storage medium, said method comprising the steps of:
    partitioning the data into k interleaves;
    encoding the data;
    storing the data on the data storage medium;

using a first physical block address (PBA) to retrieve data from the data storage medium;

decoding the data;

detecting that the data has a number of errors that exceeds a threshold;

for each interleave, flagging predetermined locations as erasures, and computing an error value for each of the predetermined locations;

determining that the errors are attributable to an incorrect PBA when the error values in each interleave are identical and in at least one interleave the error values have non-zero values.

16. The method of claim 15, said encoding step further comprising the steps of:

combining a portion of the data with a PBA string including at least k bytes of the first PBA indicating a location where the data will be stored on the data storage medium; and randomizing the data.

17. The method of claim 16, said combining step further comprising the step of merging the first k×2t bytes of the data with a PBA string including at least k bytes of the PBA repeated 2t times in sequence, where t is the error correction capacity associated with the data storage system.

18. The method of claim 16, said randomizing step further comprising the step of combining the data with a sequence of pseudo-randomly generated numbers.

19. The method of claim 15, said decoding step further comprising the steps of:

derandomizing the data; and decoding a portion of the data with a PBA string included in the first PBA.

20. The method of claim 19, said derandomizing step further comprising the step of combining the data with a pseudo-randomly generated number.

21. The method of claim 15, further comprising the step of determining a second PBA representing a location from which the data was retrieved.

22. An error correction apparatus, comprising:

a data storage medium;

a data retrieval unit coupled to the data storage medium that retrieves data from an expected physical block address (PBA) on the data storage medium;

an error correction code (ECC) logic unit coupled to the data retrieval unit that encodes data for storage on the data storage medium and decodes data retrieved from the data storage medium;

an error correction logic unit coupled to the ECC logic unit that determines whether data read from the data storage medium has uncorrectable errors; and an error analysis logic unit coupled to the error correction logic unit that determines whether a source of the uncorrectable errors is due to retrieval of the data at a PBA other than the expected PBA.

23. The apparatus of claim 22, the ECC logic unit comprising an interleave and encode logic unit that interleaves and encodes data with a PBA representing a location of the data stored on the data storage medium.

24. The apparatus of claim 23, the ECC logic unit comprising a randomizer logic unit that randomizes the interleaved and encoded data prior to storage on the data storage medium.

25. The apparatus of claim 23, the interleave and encode logic unit decodes read data with a PBA used to encode the read data.

26. The apparatus of claim 24, the randomizer logic unit derandomizes data read from the data storage medium.

27. The apparatus of claim 22, the error analysis logic unit comprising a memory having an error analysis procedure and an erasure correction procedure, the erasure correction procedure including instructions to compute an erasure value for each specified erasure location, the error analysis procedure including instructions that determines a PBA error has occurred when in each select portion of the data all the erasure values are identical and in at least one such select portion, the erasure values have non-zero values.

28. The apparatus of claim 22, the error analysis logic unit determines an actual PBA from which the erroneous data was read.

29. The apparatus of claim 28, the error analysis logic unit initiating retrieval of data at the expected PBA.

* * * * *